Figure 1:
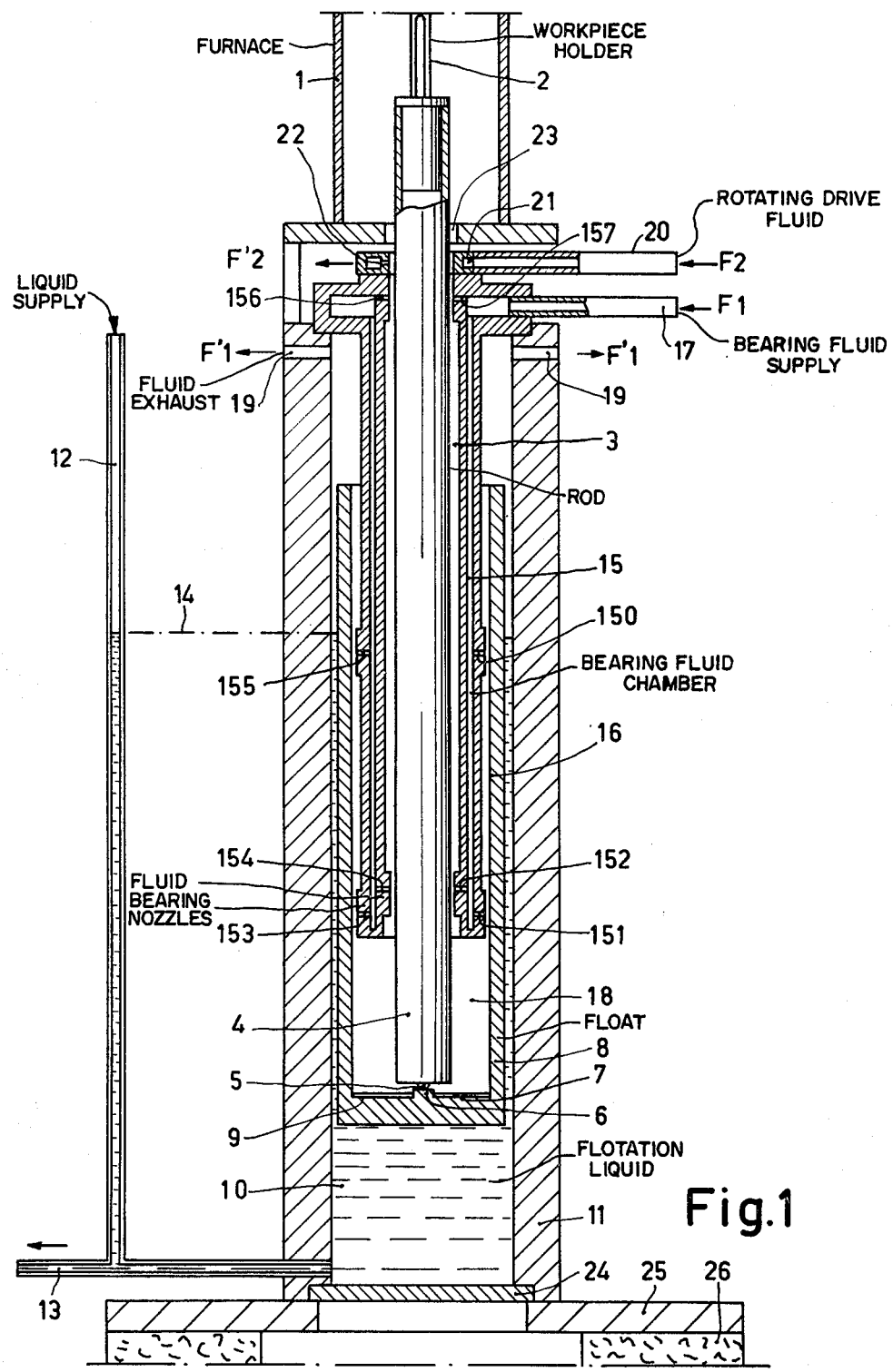

United States Patent [19]

Tranchart et al.

[11] 3,966,416
[45] June 29, 1976

[54] SINGLE CRYSTAL GROWTH APPARATUS WITH FLUID BEARING AND FLUID DRIVE MEANS

[75] Inventors: Jean-Claude Tranchart, Morsang-sur-Orge; Jacques Charles Louis Bunel, Vigneux-sur-Seine, both of France

[73] Assignee: U.S. Philips Corporation, Briarcliff Manor, N.Y.

[22] Filed: June 20, 1974

[21] Appl. No.: 481,381

[30] Foreign Application Priority Data
June 28, 1973 France .............................. 73.23686

[52] U.S. Cl. ............................................. 23/273 SP
[51] Int. Cl.² .......................................... B01D 9/00
[58] Field of Search ................... 23/273 SP, 301 SP; 156/616, 617, 618, 620, 607; 269/20, 71

[56] References Cited
UNITED STATES PATENTS

| | | |
|---|---|---|
| 3,020,131 | 2/1962 | Knapic ............................ 23/273 SP |
| 3,340,016 | 9/1967 | Wirth et al. ..................... 23/273 SP |
| 3,353,914 | 11/1967 | Pickar ................................ 156/617 |
| 3,493,348 | 2/1970 | Dessauer ........................ 23/273 SP |

FOREIGN PATENTS OR APPLICATIONS

| | | |
|---|---|---|
| 1,080,071 | 2/1959 | Germany ....................... 23/301 SP |

*Primary Examiner*—Frank W. Lutter
*Assistant Examiner*—Frank Sever
*Attorney, Agent, or Firm*—Frank R. Trifari; David R. Treacy

[57] ABSTRACT

A driving device for slow movement vertically and rotationally comprises a cylindrical central member having the workload on the upper end, and the lower end on a thrust bearing on a float immersed in a liquid whose supply can be controlled for vertical displacement.

Chambers insulated from each other, and supplied with compressed air, surround the central member. Nozzles in the chamber walls establish fluid bearings to self-center the central member and to rotate it.

9 Claims, 2 Drawing Figures

SINGLE CRYSTAL GROWTH APPARATUS WITH FLUID BEARING AND FLUID DRIVE MEANS

The present invention relates to a driving device for a single crystal growth apparatus comprising a tank containing a liquid, the level of which is controlled by means outside the device, a float having a cylindrical hollow shape and being immersed in the liquid, and a cylindrical central member penetrating the float and being vertically movable with the float, said float having a height which is considerably less than that of the central member.

In certain embodiments, notably laboratory equipment, it is desirable to perform, for example, displacements of a material or a mechanical member according to slow and regular movements without vibrations or shocks.

This is particularly true in the case of certain single crystal growth techniques used with the aim of obtaining said maximum purity and crystal perfection, said parameters which can determine the performance of the devices in which the single crystals are used.

Among the very important single crystals are the single crystals of cadmium telluride, CdTe, notably used in nuclear detection. Such single crystals are manufactured starting from a stoichiometric material of tellurium and cadmium atoms obtained by direct synthesis starting from the elements.

Said material is then purified and made monocrystalline by the so-called T.H.M. method or "Travelling Heater Method", according to which a zone comprising a liquid solution is slowly displaced along the polycrystalline material. The material is thus purified due to the greater solubility of the impurities in the liquid phase and if the movements of displacement are very regular, a single crystal may grow spontaneously.

In order to obtain such a growth it is thus necessary to slowly displace a quartz tube containing the polycrystalline material inside an assembly of furnaces maintained at suitable temperatures.

The application of such a method necessitates the use of a very special driving device, the driving having to be slow (a hundred microns per hour), regular and insensitive to external vibrations.

The device used hitherto consisted of a frame composed of a comparatively heavy table, four vertical metal rods fixed on the table and braced at one end in the upper part and at the other end at approximately 20 cm. from the table and finally of a rod which is fixed on one of the upper braces on which two pulleys are fixed. In order to realize, for example, the lowering of the tube, it is drawn at its base by a cable which is wound on a pulley driven by electrical means, for example, a motor, and at its upper part it is held by another cable running on the two upper pulleys and at the end of which a counterweight is provided.

Such a device is not satisfactory. Actually, the vibrations due to the motor and amplified by the frame and transmitted to the tube through the pulleys and the upper cable give a jerky and very irregular displacement movement; in addition, detrimental oscillations are formed due to the pendular aspect of the construction. The fact that a cable is wound on a pulley is disadvantageous on account of the very nature of cable, which does not have a regular surface.

It is the object of the invention to mitigate the various drawbacks and to provide a device which does not have any mechanical element susceptible of producing vibrations or aleatory friction.

The present invention relates to a driving device for a single crystal growth apparatus comprising a tank containing a liquid, the level of which is controlled by means outside the device, a float having a cylindrical hollow shape and being immersed in the liquid, and a circular cylindrical central member penetrating the float and being vertically movable with the float, said float having a height which is considerably less than that of the central member. According to the invention the vertically disposed central member has an upper surface carrying a body to be moved slowly through a growth furnace and a lower surface provided with a bearing which is in contact with the center of a base of the float; a first chamber between the inner wall of the float and the central member communicating with a first gas inlet, said first chamber having an elongate shape, surrounding the central member and having throughout its height a plurality of nozzles directed towards the central member and a plurality of nozzles directed to the inner wall of the float so as to form a pneumatic bearing; and a second chamber communicating with a second gas inlet, said second chamber having an annular shape and having a plurality of nozzles directed towards the central member so disposed as to rotate the central member. The central member preferably is a straight glass rod.

A first advantage of the device is that the presence of fluid bearings permits slow and regular displacement without vibration or shocks. A second advantage is that it permits slow and regular vertical displacement accompanied by a rotational movement independently of the vertical displacement; the rotational movement permits reducing the asymmetry during crystallization when the device is used for monocrystalline growth of material. It is possible, by varying the gas supply passing through the annular chamber by which rotational movement is caused, to accelerate the movement or to reduce it voluntarily as a function of the crystal quality of the required material.

A third advantage moreover is that the device is simple to manufacture and easy to handle, and that cheap and currently used fluids may be used, such as air and water.

The following is a description with reference to the accompanying drawings, given by way of a non-limiting example, in which FIG. 1 is a cross-sectional view of a device according to the invention.

Figure 2:
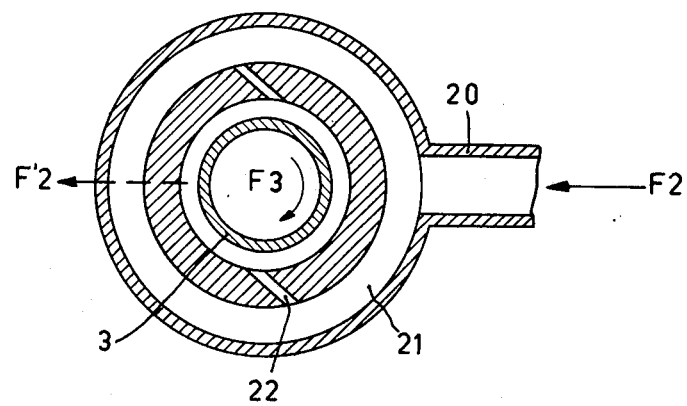

FIG. 2 is a simplified bottom view of the annular chamber for rotating the central member.

In order to facilitate comprehension of the text, the same parts are designated by the same reference numerals in the two figures.

FIG. 1 shows part of a growth furnace 1 for the monocrystalline growth of a material. In the furnace 1 a quartz tube 2 containing a crystallized mixture is moved slowly according to the method described above. The tube 2 may alternatively be a simple rod. The quartz tube 2 is extended outside the growth furnace 1 by a cylindrical member 3 which may be, for example, a glass rod. In the center of its lower end 4 the rod 3 comprises a ball bearing 5 which bears on a raised portion 6 at the middle of the bottom 7 of open cylindrical float 8. The float 8, weighted by a mass, for example, of lead, is immersed in a liquid 10. A preferred is contained in a tank 11, which liquid is water.

The level of the liquid 10 contained in the tank 11 depends on the supply of liquid through a tube 12 or, on the contrary, on the removal of liquid through the outlet of another tube 13. The removal of liquid may be carried out, for example, by evaporation or by any other suitable means.

In a preferred method of operation of the device the liquid is evaporated. While the liquid 10 evaporates, the level 14 of the liquid is lowered so that the bottom 7 of the float 8 is lowered and, through the intermediary of the raised portion 6 on which it bears, takes along the bearing 5 of the end 4 of the rod 3 which is thus also lowered. So while evaporating the liquid slowly and regularly, the rod 3 is made to lower, as a result of which the quartz tube 2 in the growth furnace 1 is also lowered.

If instead of removing liquid, liquid is added, exactly the same movement is obtained but in the opposite sense. In this case, the liquid 10 raises the bottom 7 of the float 8, the raised portion 6 of the bottom 7 then pushes the bearing 5 upwards which transmits the ascending movement to the rod 3 and then to the quartz tube 2. The tube 2 is now moved upwards in the growth furnace 1.

In the space between the float 8 and the rod 3 there is provided a chamber 15 having an elongate shape and surrounding the rod 3, and having a number of apertures provided with nozzles 150, 151, 152, 153, 154, 155, 156 and 157. Certain of the apertures are directed orthogonally to the inner wall 16 of the float 8 and other apertures face the glass rod 3. It is also possible to dispose the apertures obliquely with respect to the inner wall 16 of the float 8 and to the glass rod 3.

A fluid under pressure, for example, compressed air, is conveyed through a tube 17 in a direction $F_1$, to the chamber 15 circulates in the chamber 15 and through the nozzles 150 to 157 in the vicinity of which it forms fluid bearings; after having expanded in the fluid bearings it also occupies a space 18 bounded by the bottom 7 of the float 8 and the chamber 15 and leaves through tubes 19 in the direction $F_1'$.

Since the air circulates uninterruptedly, the fluid bearings at the level of nozzles permit the self-centering of the rod 3 with respect to the float 8; actually, the rod 3 is enveloped by the fluid and it is movable at its end 4 since it bears with the bearing 5 on the portion 6 of the bottom 7 of the float 8; for that reason, due to the pressure of the fluid which surrounds it, it may at any moment position itself very accurately in the axis of the device.

Consequently, when the liquid 10 in which the float 8 is immersed is progressively removed, the rod 8 descends progressively and regularly without shocks nor detrimental friction to the crystallization which is produced in the growth furnace 1.

Through another tube 20, another fluid under pressure, for example, also compressed air, is conveyed in the direction of the arrow F2 to an annular chamber 21 having apertures provided with nozzles 22.

FIG. 2 shows the paths for the fluid in the annular chamber 21 along the rod 3; for simplicity, the various parts of the annular chamber are not drawn to scale. As shown in the figure the rod 3 subjected to the action of the air under pressure which passes through the nozzles begins to rotate in the direction denoted by $F_3$. The rod 3 is thus driven rotationally at a speed which is easy to control by influencing the supply and the pressure of the supplied air. A number of small apertures not shown in FIG. 2 for reasons of clarity permit the air to leave the annular chamber after expansion; the air leaves in the direction $F'_2$ shown entirely in FIG. 1 and denoted diagrammatically by a broken line arrow in FIG. 2.

In FIG. 1, 23 denotes the aperture through which the glass rod 3 is passed into the driving device.

The tank 11 is closed at its base by a rigid bottom 24 provided on a plate 25 ensuring the stability of the device. The plate 25 rests on blocks 26 which absorb vibrations coming from the environment of the device and ensure a good thermal equilibrium.

Due to the presence of the two fluid chambers described, it is found possible to have slow and regular driving without shocks in a vertical direction, either upwards or downwards, and to obtain a relatively slow rotational movement added to the vertical displacement in accordance with the pressure of the fluid exerted on the rod.

When the nozzles of the chamber 15 of elongate shape are inclined with respect to the inner wall 16 of the float 8 and with respect to the glass rod 3, it is possible in the absence of compressed air circulation in the annular chamber 21 to obtain nevertheless a certain rotation of the glass rod; on the contrary, it is not possible to control the speed of rotation of the rod independently, since in that case the self centering of the rod as well as its rotation are interdependent and depend on the same compressed air pressure.

A device according to the invention has been manufactured using glass for the rod, plexiglass for the float, stainless steel for the tank and brass for the chambers in which the compressed air circulates. The liquid used was water, a rubber joint not shown in the figure ensuring perfect tightness of the bottom of the tank 11. The plate 25 was cast and the blocks 26 were of cork.

The principal dimensions were as follows: height of the tank 623 mm, height of the float 406 mm, length of the rod 616 mm, liquid section $10^4$ mm². For a regular evaporation of liquid of 1 cm³, the vertical displacement was therefore 0.1 mm.

The distance between the glass rod 3 and each nozzle of the chamber 15 of elongate shape was chosen to be 0.03 mm but may equally be between 0.005 and 0.05 mm; also, the distance between the glass rod 3 and each nozzle of the annular chamber 21 was chosen to be 0.03 mm but could also be between 0.005 and 0.05 mm. For a compressed air pressure of 1.2 bar the rotation was 5 rotations per minute.

Said dimensions are given only by way of example and may in no case be considered as limits of the invention.

Similar devices may be used notably for the growth of all those crystals which have a very slow rate of growth and which must be insulated from any mechanical contact with the exterior of the device.

What is claimed is:

1. In a driving device for a single crystal growth apparatus, for moving a body vertically and rotationally about a vertical axis through a growth furnace, comprising a tank for holding a quantity of liquid, means for controlling the level of said liquid in the tank, a hollow cylindrical float for floating in the liquid, having an inner bottom surface and an inner vertical wall having a given height, a circular cylindrical central member having a height greater than said given height, said central member positioned vertically, the improvement wherein said central member has a top portion arranged to carry said body and a bottom end disposed within said float, and said device further comprises bearing means for supporting said bottom end on said bottom surface, means for establishing a gas bearing with said central member to center said member and maintain said member vertical, and means for directing a gas flow in contact with said central member so as to rotate said member about a vertical axis.

2. A device as claimed in claim 1, wherein said means for directing comprises an annular chamber having an inner wall surrounding said central member, means for supplying a first gas under pressure above ambient to said annular chamber, and a plurality of nozzles in said inner wall for directing a flow of said gas obliquely toward said central member for rotating said central member about a vertical axis.

3. A device as claimed in claim 2, wherein said gas is air.

4. A device as claimed in claim 3, wherein a distance between the central member and a nozzle of the annular chamber is between 0.005 mm and 0.05 mm.

5. A device as claimed in claim 1, wherein said means for establishing a gas bearing comprises an elongated chamber surrounding the central member and having inner and outer walls, means for supplying a first gas under pressure above ambient to said chamber, and a plurality of nozzles in said chamber walls for directing gas under pressure above ambient toward the central member and toward the inner walls of said float to form a gas bearing between said chamber walls and said central member and float walls respectively.

6. A device as claimed in claim 5, wherein said nozzles are directed obliquely toward said central member so that flow of said gas through said nozzles causes said central member to rotate about a vertical axis.

7. A device as claimed in claim 6, wherein said gas is air, and a distance between the central member and the nozzles of said chamber walls is between 0.005 mm and 0.05 mm.

8. A device as claimed in claim 5, wherein said nozzles are directed orthogonally with respect to said central member and said inner wall, and said means for directing comprises an annular chamber having an inner wall surrounding said central member, means for supplying a second gas under pressure above ambient to said annular chamber, and a plurality of nozzles in said inner wall of said annular chamber for directing a flow of said second gas obliquely towards said central member for rotating said central member about a vertical axis.

9. A device as claimed in claim 8, wherein said first and second gases are air, and wherein a first distance between the central member and a nozzle of the elongated chamber, and a distance between the central member and a nozzle of the annular chamber, are each between 0.005 mm and 0.05 mm.

* * * * *

UNITED STATES PATENT AND TRADEMARK OFFICE
CERTIFICATE OF CORRECTION

PATENT NO. : 3,966,416
DATED : June 29, 1976
INVENTOR(S) : JEAN-CLAUDE TRANCHART ET AL It is certified that error appears in the above-identified patent and that said Letters Patent are hereby corrected as shown below:

Col. 1, line 21, after "ing" delete "said"; after "perfection," delete "said"

Col. 2, line 67, after "liquid 10" delete "." and insert --which is contained in a tank 11.-- line 68, delete "is contained in a tank 11, which"

Col. 3, line 36, after "15" insert --. It--

Signed and Sealed this

First Day of March 1977

[SEAL]

Attest:

RUTH C. MASON
*Attesting Officer*

C. MARSHALL DANN
*Commissioner of Patents and Trademarks*